US012615596B2

(12) United States Patent
Anderson et al.

(10) Patent No.: US 12,615,596 B2
(45) Date of Patent: Apr. 28, 2026

(54) OUTPUT HARMONICS, OUTPUT POWER, AND EFFICIENCY CONTROL FOR RADIO FREQUENCY (RF) POWER AMPLIFIERS

(71) Applicant: Synaptics Incorporated, San Jose, CA (US)

(72) Inventors: Steve Anderson, Netanya (IL); Avi Cohen, Bnay-Dror (IL)

(73) Assignee: Synaptics Incorporated, San Jose, CA (US)

( * ) Notice: Subject to any disclaimer, the term of this patent is extended or adjusted under 35 U.S.C. 154(b) by 216 days.

(21) Appl. No.: 18/457,726

(22) Filed: Aug. 29, 2023

(65) Prior Publication Data

US 2025/0081121 A1 Mar. 6, 2025

(51) Int. Cl.
*H04W 52/18* (2009.01)
*H03F 3/24* (2006.01)

(52) U.S. Cl.
CPC ............ *H04W 52/18* (2013.01); *H03F 3/245* (2013.01); *H03F 2200/451* (2013.01)

(58) Field of Classification Search
CPC ..... H04W 52/18; H04W 52/367; H03F 3/245; H03F 2200/451; H03F 1/3211;
(Continued)

(56) References Cited

U.S. PATENT DOCUMENTS 5,790,601 A * 8/1998 Corrigan, III ..... H04B 7/18517
455/113
10,135,409 B1 11/2018 Cousinard et al.
(Continued)

FOREIGN PATENT DOCUMENTS

| CN | 113824411 A | * 12/2021 | ............ H03F 3/245 |
| CN | 113922777 A | 1/2022 | |
| CN | 114669436 A | 6/2022 | |

OTHER PUBLICATIONS

Heidebrecht et al., "Fully Integrated Wideband Doherty PA with Additive-Voltage Supported Load-Modulation in CMOS 130nm," 2019 IEEE Mtt-S International Microwave Symposium (IMS), Boston, MA, USA, 2019, pp. 1331-1334, doi: 10.1109/MWSYM. 2019.8700774.

(Continued)

*Primary Examiner* — Lana N Le
(74) *Attorney, Agent, or Firm* — Paradice & Li LLP

(57) ABSTRACT

This disclosure provides methods, devices, and systems for wireless communications. The present implementations more specifically relate to reducing the power consumption of radio frequency (RF) power amplifiers without sacrificing power efficiency. In some aspects, an RF transmitter may include a modulator, a power amplifier, and a duty cycle controller coupled between the modulator and the power amplifier. The modulator is configured to modulate data onto a carrier signal according to a frequency modulation (FM) scheme. The duty cycle controller is configured to adjust a duty cycle of the FM signal based on a target output power associated with the power amplifier. In some implementations, the duty cycle controller may reduce the duty cycle of the FM signal so that the adjusted duty cycle causes the power amplifier to operate at the target output power. The power amplifier amplifies the adjusted FM signal for transmission over a wireless communication channel.

19 Claims, 8 Drawing Sheets

(58) Field of Classification Search
CPC ........ H03F 3/217; H03F 3/45475; H03F 3/19; H03K 5/06; H03K 7/08; H03K 7/06; H03K 5/131; H04L 27/12; H04B 2203/5416; H04B 3/546
See application file for complete search history.

(56) References Cited

U.S. PATENT DOCUMENTS

| 10,256,854 | B1 | 4/2019 | Srinivasan et al. |
| 2002/0180547 | A1 | 12/2002 | Staszewski et al. |
| 2008/0290938 | A1 | 11/2008 | Gupta et al. |
| 2009/0149151 | A1 | 6/2009 | Bryant |
| 2009/0270056 | A1 | 10/2009 | Singerl et al. |
| 2010/0225369 | A1 | 9/2010 | Badaroglu |
| 2011/0018640 | A1 | 1/2011 | Liang et al. |
| 2011/0129037 | A1 | 6/2011 | Staszewski et al. |
| 2011/0267127 | A1 | 11/2011 | Staszewski et al. |
| 2012/0081179 | A1* | 4/2012 | Visser .................. H03F 1/02 330/251 |
| 2012/0214433 | A1 | 8/2012 | Shimizu |
| 2014/0125410 | A1 | 5/2014 | Pamarti et al. |
| 2014/0159933 | A1 | 6/2014 | Dufrene et al. |
| 2014/0355717 | A1 | 12/2014 | Lu et al. |
| 2015/0139360 | A1 | 5/2015 | Visser et al. |
| 2016/0261293 | A1* | 9/2016 | Adabi .................. H04B 1/0458 |
| 2016/0329935 | A1 | 11/2016 | Singerl et al. |
| 2018/0275229 | A1 | 9/2018 | Alexeyev |
| 2019/0207570 | A1* | 7/2019 | Govindaraj ............. H03F 3/245 |
| 2021/0336526 | A1 | 10/2021 | Ayati et al. |
| 2022/0158346 | A1* | 5/2022 | Marr, Jr. .................. H03F 3/19 |
| 2022/0316843 | A1 | 10/2022 | Dower et al. |
| 2022/0385248 | A1* | 12/2022 | Liu ......................... H03F 3/217 |
| 2024/0186948 | A1 | 6/2024 | Myoung et al. |
| 2025/0234305 | A1 | 7/2025 | Anderson et al. |

OTHER PUBLICATIONS

Jung et al., "A 1.2 V Single Supply Hybrid Current-/Voltage-Mode Three-Way Digital Doherty PA with Built-In Large-Signal Phase Compensation Achieving Less-Than 5○ AM-PM," 2019 IEEE Custom Integrated Circuits Conference (CICC), Austin, TX, USA, 2019, pp. 1-4, doi: 10.1109/CICC.2019.8780290.

Khodkumbhe et al., "Preserving Polar Modulated Class-E Power Amplifier Linearity under Load Mismatch," 2020 IEEE Radio Frequency Integrated Circuits Symposium (RFIC), Los Angeles, CA, USA, 2020, pp. 295-298, doi: 10.1109/RFIC49505.2020.9218279.

Yu et al., "A High-Voltage-Enabled Class-D Polar PA Using Interactive AM-AM Modulation, Dynamic Matching, and Power-Gating for Average PAE Enhancement," in IEEE Transactions on Circuits and Systems I: Regular Papers, vol. 64, No. 11, pp. 2844-2857, Nov. 2017, doi: 10.1109/TCSI.2017.2703584.

European Search Report dated Jun. 24, 2025, from EP Application No. 25151919.5-1201.

Extended EP Search Report dated Jan. 24, 2025, from EP Application No. 24196937.7-1201.

* cited by examiner

FM Signal
302

Duty Cycle = 50%

Period = $T_0$

Delayed FM
Signal 304

Duty Cycle = 50%

Period = $T_0$

DCA FM
Signal 306

25%

$t_0$    $t_1$    $t_2$    $t_3$    $t_4$    $t_5$    $t_6$

OUTPUT HARMONICS, OUTPUT POWER, AND EFFICIENCY CONTROL FOR RADIO FREQUENCY (RF) POWER AMPLIFIERS

TECHNICAL FIELD

The present implementations relate generally to wireless communication, and specifically to output harmonics, output power, and efficiency control for radio frequency (RF) power amplifiers.

BACKGROUND OF RELATED ART

Wireless communication devices rely on radio frequency (RF) transmitters and receivers (also referred to as "wireless radios") to communicate with other devices over a wireless communication channel. An RF transmitter modulates data or other information onto a carrier wave and upconverts the modulated waveform to a radio frequency (such as 2.4 GHZ), for example, by mixing the modulated waveform with a local oscillator (LO) signal that oscillates at the radio frequency. The resulting RF signal is further amplified by a power amplifier for transmission over the wireless channel via one or more antennas. Different classes of power amplifiers are designed to provide different levels of power efficiency. For example, linear class power amplifiers (such as class A, class B, and class AB amplifiers) sacrifice power efficiency to provide a more linear response or power curve. By contrast, nonlinear class power amplifiers (such as class C, class D, class E, and class F amplifiers) offer greater power efficiency but suffer from nonlinear response.

Many wireless communication devices are battery-operated devices with limited power budgets. As such, many wireless communication devices implement wireless radios with nonlinear class power amplifiers to achieve better power efficiency. However, a nonlinear class power amplifier achieves its maximum power efficiency when operating at its maximum supported output power, whereas the power efficiency tends to degrade when operating at a lower output power. In other words, nonlinear class power amplifiers have a relatively narrow dynamic range in terms of linearity and efficiency. Thus, there is a need to reduce the power consumption of an RF power amplifier without sacrificing power efficiency.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the subject matter of this disclosure can be implemented in a method performed by a duty cycle controller for a wireless communication device. The method includes receiving a frequency-modulated (FM) signal having a constant envelope waveform; adjusting a duty cycle of the constant-envelope FM signal based at least in part on a target output power associated with a power amplifier of the wireless communication device; and outputting the constant-envelope FM signal, after adjusting the duty cycle, to the power amplifier for transmission over a wireless communication channel.

Another innovative aspect of the subject matter of this disclosure can be implemented in a duty cycle controller for a wireless communication device. The duty cycle controller includes a delay line and control circuitry coupled to the delay line. The delay line is configured to receive an FM signal having a constant envelope waveform. The control circuitry is configured to adjust a duty cycle of the constant-envelope FM signal based at least in part on a target output power associated with a power amplifier of the wireless communication device and output the constant-envelope FM signal, after adjusting the duty cycle, to the power amplifier for transmission over a wireless communication channel.

Another innovative aspect of the subject matter of this disclosure can be implemented in a system including a modulator, a power amplifier, and a duty cycle controller. The modulator is configured to modulate data onto a carrier signal according to a constant envelope frequency modulation (FM) scheme. The power amplifier is configured to amplify the modulated carrier signal for transmission over a wireless communication channel. The duty cycle controller is configured to adjust a duty cycle of the modulated carrier signal, prior to being amplified by the power amplifier, based at least in part on a target output power associated with the power amplifier.

BRIEF DESCRIPTION OF THE DRAWINGS

The present implementations are illustrated by way of example and are not intended to be limited by the figures of the accompanying drawings.

DETAILED DESCRIPTION

Figure 1:
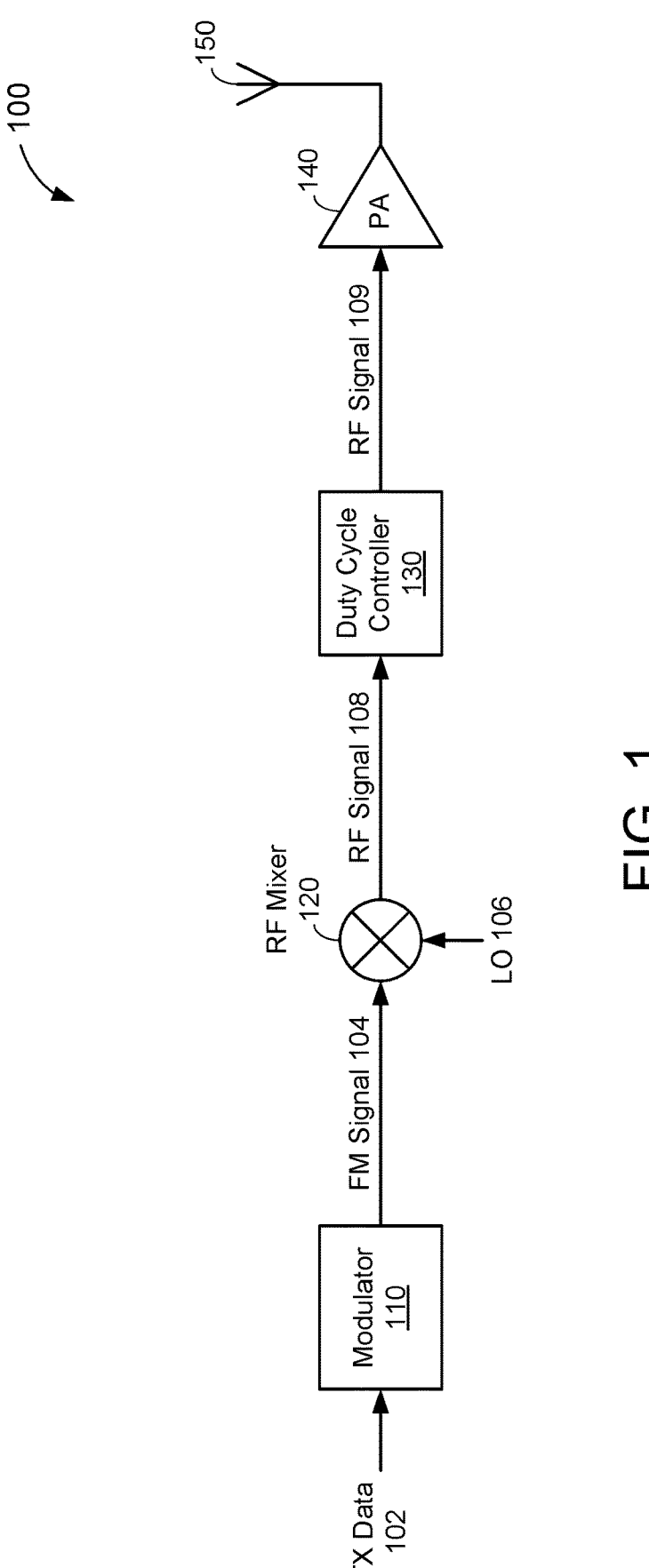
FIG. 1 shows a block diagram of an example radio frequency (RF) transmitter, according to some implementations.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium including instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random-access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors (or a processing system). The term "processor," as used herein may refer to any general-purpose processor, special-purpose processor, conventional processor, controller, microcontroller, and/or state machine capable of executing scripts or instructions of one or more software programs stored in memory.

As described above, a radio frequency (RF) transmitter modulates data or other information onto a carrier wave and upconverts the modulated waveform to a radio frequency (such as 2.4 GHZ) for example, by mixing a constant envelope modulated waveform with a local oscillator (LO) signal that oscillates at the radio frequency. The resulting RF signal is further amplified by a power amplifier for transmission over a wireless communication channel via one or more antennas. Many wireless communication devices are battery-operated devices with limited power budgets. As such, many wireless communication devices implement wireless radios with nonlinear class power amplifiers to achieve better power efficiency. However, a nonlinear class power amplifier achieves its maximum power efficiency when operating at its maximum supported output power, whereas the power efficiency tends to degrade when operating at a lower output power. In other words, nonlinear class power amplifiers have a relatively narrow dynamic range in terms of linearity and efficiency.

Many nonlinear class power amplifiers are designed with transistors operating as switches that supply current to an output load. For example, the drain (or source) of a transistor may be coupled to a high voltage potential (such as a voltage source), the source (or drain) of the transistor may be coupled to a low voltage potential (such as ground), and the gate of the transistor may be driven by the input RF signal. As a result, the transistor typically operates in the saturation region, delivering an amount of current between its source and drain terminals depending on the voltage or amplitude of the input RF signal. The power consumption of the power amplifier depends on the amount and duration of current supplied by the transistor to the output load (such as when the voltage of the input RF signal is above a voltage threshold). Aspects of the present disclosure recognize that the power consumption of such power amplifiers can be reduced, without sacrificing efficiency, by reducing or shortening the duty cycle of the input RF signal.

Various aspects relate generally to RF power amplifiers, and more particularly, to techniques for reducing the power consumption of RF power amplifiers without sacrificing power efficiency. In some aspects, an RF transmitter may include an FM modulator, a power amplifier, and a duty cycle controller coupled between the modulator and the power amplifier. The FM modulator is configured to modulate data onto a carrier signal according to a frequency modulation scheme. Thus, the modulated carrier signal also may be referred to as a frequency-modulated (FM) signal. The duty cycle controller is configured to adjust a duty cycle of the FM signal based at least in part on a target output power associated with the power amplifier. The target output power may be less than a maximum power output of the power amplifier. In some implementations, the duty cycle controller may reduce the duty cycle of the FM signal so that the adjusted duty cycle causes the power amplifier to operate at the target output power. The power amplifier amplifies the adjusted FM signal for transmission over a wireless communication channel.

Particular implementations of the subject matter described in this disclosure can be implemented to realize one or more of the following potential advantages. By reducing the duty cycle of the FM signal prior to being amplified by the power amplifier, aspects of the present disclosure can significantly reduce the power consumption of the power amplifier with little or no reduction in power efficiency. For example, reducing the duty cycle of the FM signal reduces the duration in which the power amplifier is conducting current and also reduces the output power of the power amplifier while maintaining constant or consistent power efficiency over a relatively large dynamic range. This allows the power amplifier to operate with relatively high power efficiency while reducing the overall power consumption over time. For example, an FM signal having a 25% duty cycle consumes significantly less power from the power amplifier, over a given duration, compared to an FM signal modulated with the same data or information with a 50% duty cycle.

FIG. 1 shows a block diagram of an example RF transmitter 100, according to some implementations. The RF transmitter 100 is configured to transmit (TX) data 102 or other digital information, on behalf of a wireless communication device, over a wireless communication channel. In some aspects, the RF transmitter 100 may conform to one or more wireless communication standards. Example suitable wireless communication standards include Digital Enhanced Cordless Telecommunications (DECT), Zigbee, and Bluetooth, among other examples.

The RF transmitter 100 includes a modulator 110, an RF mixer 120, a duty cycle controller 130, and a power amplifier (PA) 140. The modulator 110 is configured to modulate the TX data 102 onto a carrier signal or waveform. In some implementations, the modulator 110 may be an FM modulator that modulates the TX data 102 onto the carrier signal according to a frequency modulation scheme. More specifically, the modulator 110 varies the frequency of the carrier signal, without changing its amplitude, to produce a frequency-modulated (FM) signal 104 having a constant envelope. Example suitable FM modulators include voltage-controlled oscillator (VCO), crystal oscillator (XO), and phase-locked loop (PLL) circuits, among other examples.

The RF mixer 120 upconverts the FM signal 104 to a radio frequency. For example, the RF mixer 120 may mix the FM signal 104 with a local oscillator (LO) signal 106 that oscillates at the radio frequency. The resulting upconverted FM signal may be referred to as a "radio-frequency" (RF) signal 108. The power amplifier 140 is configured to amplify RF signals for transmission via one or more antennas 150. In some implementations, the power amplifier 140 may be a nonlinear class RF power amplifier with relatively high power efficiency. Example suitable nonlinear class power amplifiers include class C, class D, class E, and class F amplifiers, among other examples.

Aspects of the present disclosure recognize that the duty cycle of the RF signal amplified by the power amplifier 140 controls the duration in which current flows through the power amplifier 140 (which correlates with the power consumption of the power amplifier 140) over a given period of oscillation. However, many FM modulators are designed to produce FM signals having fixed duty cycles (such as 50%). In some aspects, the duty cycle controller 130 may control the power consumption of the power amplifier 140 by adjusting the duty cycle of the RF signal 108. More specifically, the duty cycle controller 130 may produce an RF signal 109 having the same frequency and amplitude, but a different duty cycle, as the RF signal 108. As a result, the TX data 102 is also carried on the RF signal 109 and the power efficiency of the power amplifier 140 remains relatively unchanged.

In some implementations, the duty cycle controller 130 may reduce the duty cycle of the RF signal 109 (such as below 50%). The reduced duty cycle lowers both the output power and power consumption of the power amplifier 140 over time without sacrificing power efficiency. Thus, in some implementations, the duty cycle controller 130 may reduce the duty cycle of the RF signal 108 based, at least in part, on a target or desired output power associated with the power amplifier 140. For example, the target output power may be less than a maximum power output of the power amplifier 140 but still suitable for a given wireless communication application.

Figure 2:
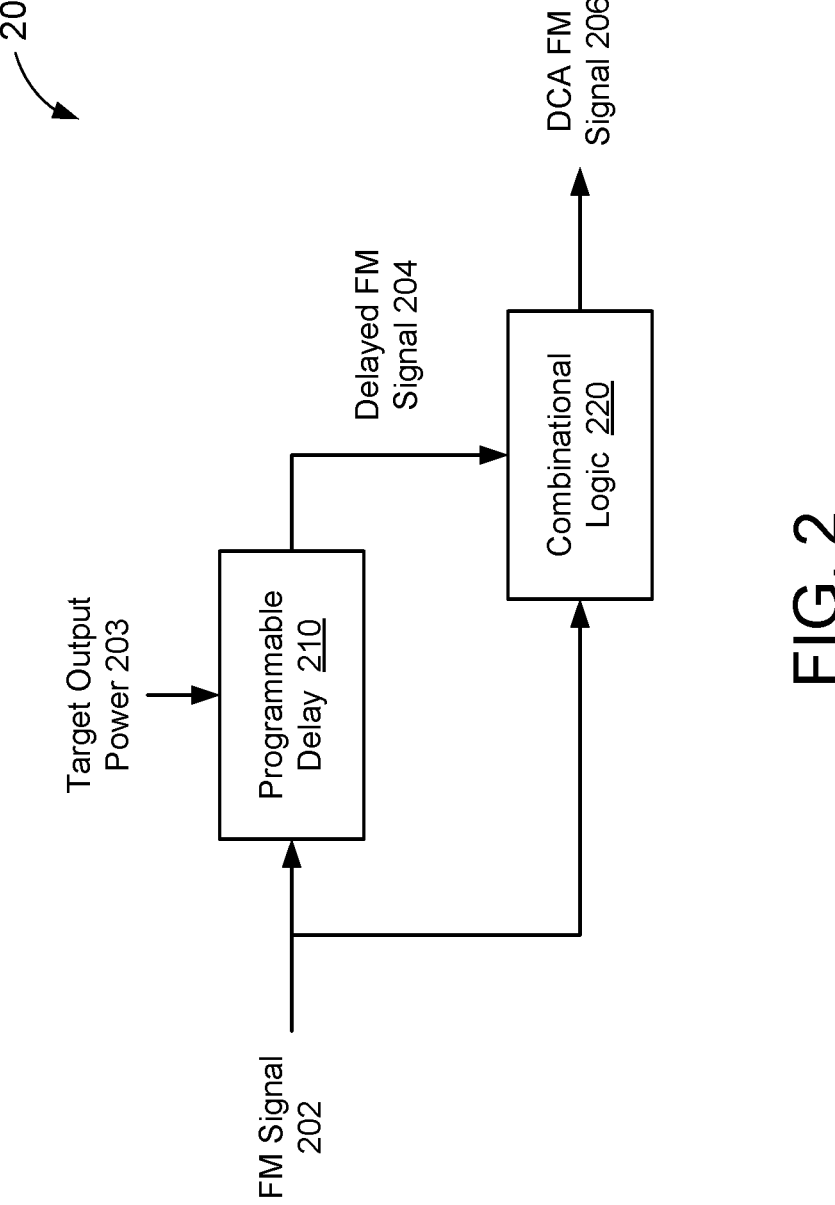
FIG. 2 shows a block diagram of an example duty cycle controller, according to some implementations.

FIG. 2 shows a block diagram of an example duty cycle controller 200, according to some implementations. The duty cycle controller 200 is configured to adjust the duty cycle of a frequency-modulated (FM) signal 202. More specifically, the duty cycle controller 200 produces a duty-cycle adjusted (DCA) FM signal 206 having the same frequency and amplitude as the FM signal 202, but different duty cycle. In some implementations, the duty cycle controller 200 may be one example of the duty cycle controller 130 of FIG. 1. With reference to FIG. 1, the FM signal 202 may be one example of the RF signal 108 input to the duty cycle controller 130 and the DCA FM signal 206 may be one example of the RF signal 109 output by the duty cycle controller 130 to the power amplifier 140.

The duty cycle controller 200 includes a programmable delay component 210 and a combinational logic component 220. The programmable delay component 210 is configured to delay the FM signal 202 by a given duration, resulting in a delayed FM signal 204. Accordingly, the delayed FM signal 204 and the input FM signal 202 have the same frequency and amplitude but different phases. In some implementations, the programmable delay component 210 may delay the FM signal 202 based on a target output power 203 associated with a power amplifier used to transmit the DCA FM signal 206 (such as the power amplifier 140 of FIG. 1). As described with reference to FIG. 1, the target output power 203 may represent the power at which the DCA FM signal 206 is to be transmitted by the power amplifier.

The combinational logic component 220 is configured to produce the DCA FM signal 206 based on the FM signal 202 and the delayed FM signal 204. In some implementations, the combinational logic component 220 may combine the FM signal 202 with the delayed FM signal 204 using combinational logic to produce the DCA FM signal 206. For example, the combinational logic component 220 may include an AND logic gate having inputs to receive the FM signal 202 and the delayed FM signal 204, and an output to provide the DCA FM signal 206 as the logic-AND combination of the input signals 202 and 204. As a result, the DCA FM signal 206 has the same frequency as the original FM signal 202 but a different duty cycle (due to differences in phase between the FM signal 202 and the delayed FM signal 204).

Aspects of the present disclosure recognize that the difference in phase between the FM signal 202 and the delayed FM signal 204 determines the duty cycle of the DCA FM signal 206. Thus, the programmable delay component may control the duty cycle of the DCA FM signal 206 based on the delay applied to the FM signal 202. As described with reference to FIG. 1, the duty cycle of the DCA FM signal 206 affects the output power of the power amplifier when transmitting the DCA FM signal 206. For example, reducing the duty cycle of the DCA FM signal 206 also reduces the output power of the power amplifier. In some implementations, the programmable delay component 210 may tune the delay associated with the delayed FM signal 204 so that the resulting duty cycle of the DCA FM signal 206 causes the power amplifier to transmit the DCA FM signal 206 at the target output power 203.

Figure 3:
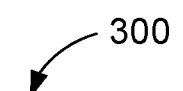
FIG. 3 shows a timing diagram depicting an example operation of a duty cycle controller, according to some implementations.

FIG. 3 shows a timing diagram 300 depicting an example operation of a duty cycle controller, according to some implementations. The duty cycle controller is configured to adjust a duty cycle of an FM signal 302. More specifically, the duty cycle controller delays the FM signal 302 to produce a delayed FM signal 304 and combines the FM signal 302 with the delayed FM signal 304 using combinational logic to produce a DCA FM signal 306 having the same frequency and amplitude as the FM signal 302, but a different duty cycle. In some implementations, the duty cycle controller may be one example of the duty cycle controller 200 of FIG. 2. With reference to FIG. 2, the FM signal 302, the delayed FM signal 304, and the DCA FM signal 306 may be examples of the FM signal 202, the delayed FM signal 204, and the DCA FM signal 206, respectively.

As shown in FIG. 3, the FM signal 302 has a 50% duty cycle spanning a period ($T_0$) from times $t_0$ to $t_4$. More specifically, the FM signal 302 has a relatively high amplitude or voltage (representing a "high" logic state) between times $t_0$ and $t_2$ and a relatively low amplitude or voltage (representing a "low" logic state) between times $t_2$ and $t_4$. The delayed FM signal 304 has a 50% duty cycle spanning a period $T_0$ from times $t_1$ to $t_5$. More specifically, the delayed FM signal 304 has a relatively high amplitude or voltage between times $t_1$ and $t_3$ and a relatively low amplitude or voltage between times $t_3$ and $t_5$. In the example of FIG. 3, the delayed FM signal 304 is 90° out of phase with the FM signal 302. In other words, the delayed FM signal 304 transitions from low to high (at time $t_1$) halfway between times $t_0$ and $t_2$, and transitions from high to low (at time $t_3$) halfway between times $t_2$ and $t_4$.

Figure 4:
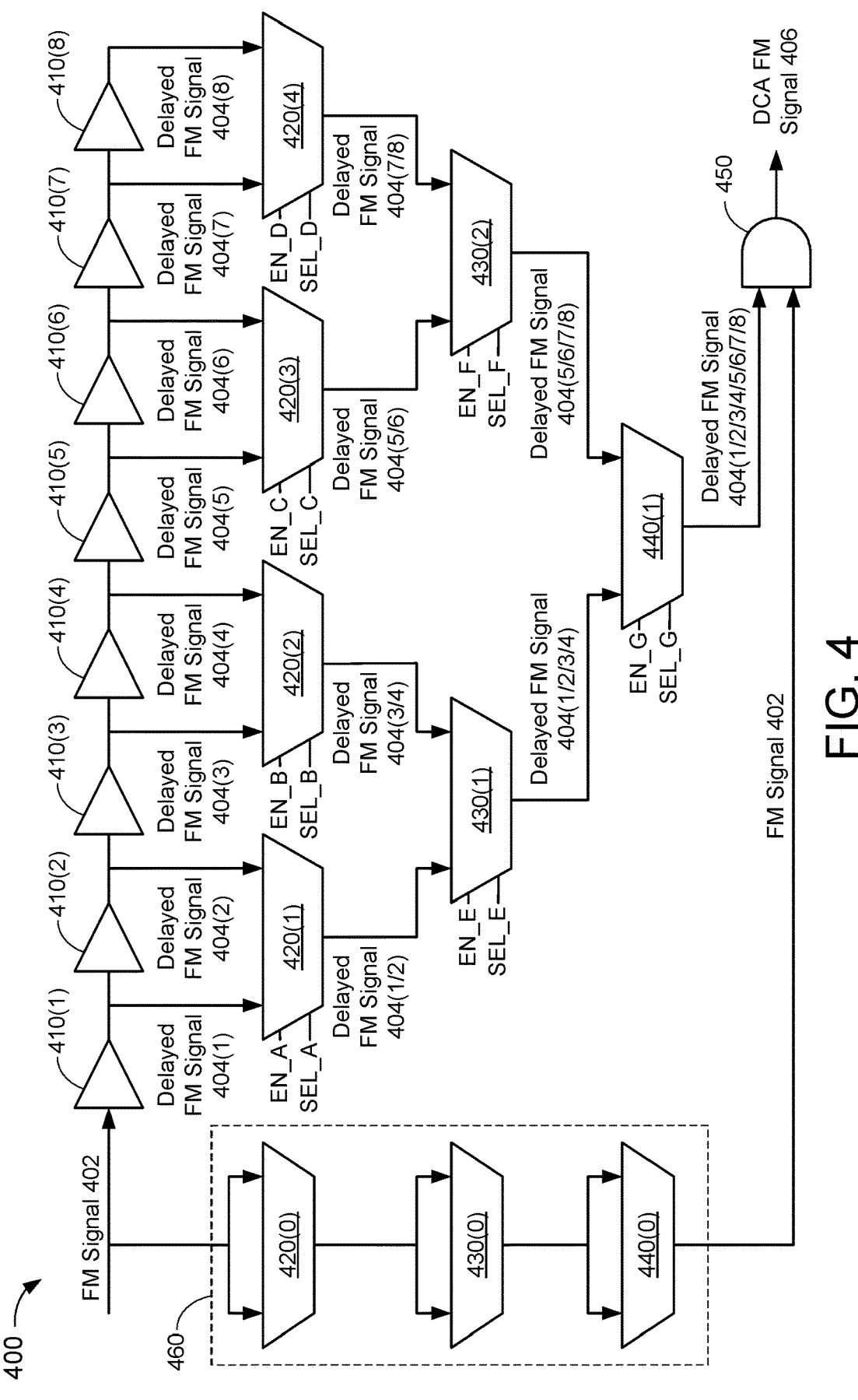
FIG. 4 shows a circuit diagram of an example duty cycle controller, according to some implementations.

In the example of FIG. 3, the DCA FM signal 306 represents the logical AND of the FM signal 302 and the delayed FM signal 304. Thus, the DCA FM signal 306 has a relatively low amplitude or voltage from times $t_0$ to $t_1$ before transitioning to a relatively high amplitude or voltage at time $t_1$ (coinciding with a low-to-high transition of the delayed FM signal 304). The DCA FM signal 306 maintains the high amplitude or voltage from times $t_1$ to $t_2$ until transitioning back to the low amplitude or voltage at time $t_2$ (coinciding with a high-to-low transition of the FM signal 302). The DCA FM signal 306 maintains the low amplitude or voltage from times $t_2$ to $t_5$ until transitioning back to the high amplitude or voltage at time $t_5$ (coinciding with another low-to-high transition of the delayed FM signal 304). As a result, the DCA FM signal 306 has a 25% duty cycle spanning a period $T_0$ from times $t_1$ to $t_5$. In other words, the duty cycle controller of FIG. 3 reduces the duty cycle of the FM signal 302 by half. FIG. 4 shows a circuit diagram of an example duty cycle controller 400, according to some implementations. The duty cycle controller 400 is configured to adjust the duty cycle of an FM signal 402. More specifically, the duty cycle controller 400 produces a DCA FM signal 406 having the same frequency and amplitude as the FM signal 402, but a different duty cycle. In some implementations, the duty cycle controller 400 may be one example of the duty cycle controller 200 of FIG. 2. With reference to FIG. 2, the FM signal 402 may be one example of the FM signal 202 and the DCA FM signal 406 may be one example of the DCA FM signal 206.

The duty cycle controller 400 includes a tapped delay line formed by a series of delay stages 410(1)-410(8), switching circuitry formed by multiple levels of multiplexers 420(1)-420(4), 430(1), 430(2), and 440(1), and a logic gate 450. The first delay stage 410(1) delays the FM signal 402 by a fixed or predetermined amount, resulting in a delayed FM signal 404(1). Each of the subsequent delay stages 410(2)-410(8) applies an equivalent amount of delay (as the first delay stage 410(1)) to the output of the preceding delay stage, resulting in additional delayed FM signals 404(2)-404(8), respectively. Thus, each of the delayed FM signals 404(1)-404(8) has a different phase offset relative to the original FM signal 402. Although eight delay stages 410(1)-410(8) are shown in FIG. 4, the delay line may include fewer or more delay stages in actual implementations.

The switching circuitry is configured to select one of the delayed FM signals 410(1)-410(8) to be combined with the original FM signal 402 at the logic gate 450. In some implementations, each of the multiplexers 420(1)-420(4), 430(1), 430(2), and 440(1) may be selectively enabled or disabled based on a respective enable signal (EN_A-EN_G). When a particular multiplexer is enabled (such as when the respective enable signal is driven to a logic-high state), the multiplexer outputs one of the delayed FM signals at its input terminals in response to a respective select signal (SEL_A-SEL_G). When a particular multiplexer is disabled (such as when the respective enable signal is driven to a logic-low state), the multiplexer does not output any of the delayed FM signals at its input terminals. In some implementations, the switching circuitry may iteratively halve the number of delayed FM signals across each layer of multiplexers until only one of the delayed FM signals 410(1)-410(8) remains.

In the example of FIG. 4, the first level of multiplexers 420(1)-420(3) may selectively output up to 4 of the delayed FM signals 410(1)-410(8). For example, when multiplexer 420(1) is enabled (such as when the enable signal EN_A is high), the multiplexer 420(1) may output one of the delayed FM signals 404(1) or 404(2) based on a first select signal SEL_A. When multiplexer 420(2) is enabled (such as when the enable signal EN_B is high), the multiplexer 420(2) may output one of the delayed FM signals 404(3) or 404(4) based on a second select signal SEL_B. When multiplexer 420(3) is enabled (such as when the enable signal EN_C is high), the multiplexer 420(3) may output one of the delayed FM signals 404(5) or 404 (6) based on a third select signal SEL_C. When multiplexer 420(4) is enabled (such as when the enable signal EN_D is high), the multiplexer 420(4) may output one of the delayed FM signals 404(7) or 404(8) based on a fourth select signal (SEL_D).

The second level of multiplexers 430(1) and 430(2) may selectively output up to 2 of the delayed FM signals output by the first level of multiplexers 420(1)-420(4). For example, when multiplexer 430(1) is enabled (such as when the enable signal EN_E is high), the multiplexer 430(1) may output one of the delayed FM signals from the multiplexers 420(1) or 420(2) based on a fifth select signal SEL_E. When multiplexer 430(2) is enabled (such as when the enable signal EN_F is high), the multiplexer 430(2) may output one of the delayed FM signals from the multiplexers 420(3) or 420(4) based on a sixth select signal SEL_F. As such, the multiplexer 430(1) may output one of the delayed FM signals 404(1)-404(4) and the multiplexer 430(2) may output one of the delayed FM signals 404(5)-404(8). When the multiplexer 440(1) is enabled (such as when the enable signal EN_G is high), the multiplexer 440(1) outputs one of the delayed FM signals from the multiplexers 430(1) and 430(2) based on a seventh select signal (SEL_G). As a result, the multiplexer 440(1) may output exactly one of the delayed FM signals 404(1)-404(8).

The logic gate 450 is configured to combine the delayed FM signal output by the multiplexer 440(1) with the FM signal 402, using combinational logic, to produce the DCA FM signal 406. In the example of FIG. 4, the logic gate 450 is depicted as an AND logic gate that produces an output signal based on the logical AND of two input signals (such as described with reference to FIG. 3). In some other implementations, the logic gate 450 may implement various other logic suitable for producing the DCA FM signal 406 (such as NAND logic). With reference to FIG. 3, the FM signal 402 may be one example of the FM signal 302, the delayed FM signal output by the multiplexer 440(1) may be one example of the delayed FM signal 304, and the DCA FM signal 406 may be one example of the DCA FM signal 306. As a result, the DCA FM signal 406 has the same amplitude as the original FM signal 402, but a different duty cycle.

The duty cycle of the DCA FM signal 406 depends on which of the delayed FM signals 404(1)-404(8) is provided as input to the logic gate 450. For example, a delayed FM signal associated with fewer delay stages (such as the delayed FM signal 404(1)) may produce a DCA FM signal 406 having a greater duty cycle than a delayed FM signal associated with more delay stages (such as the delayed FM signal 404(8)). The select signals SEL_A-SEL_G, in combination with the enable signals EN_A-EN_G, control the outputs of the multiplexers 420(1)-420(4), 430(1), 430(2), and 440(1). As such, the values of the select signals SEL_A-SEL_G and the enable signals EN_A-EN_G determine the duty cycle of the DCA FM signal 406. In some implementations, the duty cycle controller 400 may receive a digital control word indicating the values of the select signals SEL_A-SEL_G and the enable signals EN_A-EN_G. As described with reference to FIG. 2, the duty cycle of the DCA FM signal 406 affects the output power of the power amplifier used to transmit the DCA FM signal 406. Thus, in some implementations, the digital control word may be associated with a target output power of the power amplifier (such as the target output power 203 of FIG. 2).

Aspects of the present disclosure recognize that each of the multiplexers 420(1)-420(4), 430(1), 430(2), and 440(1) may add an amount of switching delay to the delayed FM signal at its output. In some aspects, the duty cycle controller 400 may adjust the FM signal 402 to compensate for the switching delay associated with the multiplexers 420(1)-420(4), 430(1), 430(2), and 440(1). For example, the duty cycle controller 400 may include a switching delay (SD) compensation component 460 which applies an amount of delay to the FM signal 402 substantially equal to the delay applied to the delayed FM signals 404(1)-404(8) by the multiplexers 420(1)-420(4), 430(1), 430(2), and 440(1). In some implementations, the SD compensation component 460 may include a series of multiplexers 420(0), 430(0), and 440(0)

associated with the first, second, and third levels of multiplexers, respectively, forming the switching circuitry of the duty cycle controller 400.

The first multiplexer 420(0) is configured to receive the FM signal 402, as its input(s), and outputs the FM signal 402 to the second multiplexer 430(0), which outputs the FM signal 402 to the third multiplexer 440(0), which outputs the FM signal 402 to the logic gate 450. Thus, the FM signal 402 is delayed by a switching delay, through the first multiplexer 420(0), equivalent to the switching delays associated with the multiplexers 420(1)-420(4). The resulting FM signal 402 is delayed by another switching delay, through the second multiplexer 430(0), equivalent to the switching delays associated with the multiplexers 430(1) and 430(2). The resulting FM signal 402 is delayed by yet another switching delay, through the third multiplexer 440(0), equivalent to the switching delays associated with the multiplexer 440(1). As a result, the switching delays applied to the FM signal 402 at the first input of the logic gate 450 offset the switching delays applied to the delayed FM signal when the signals are combined at the logic gate 450.

Figure 5:
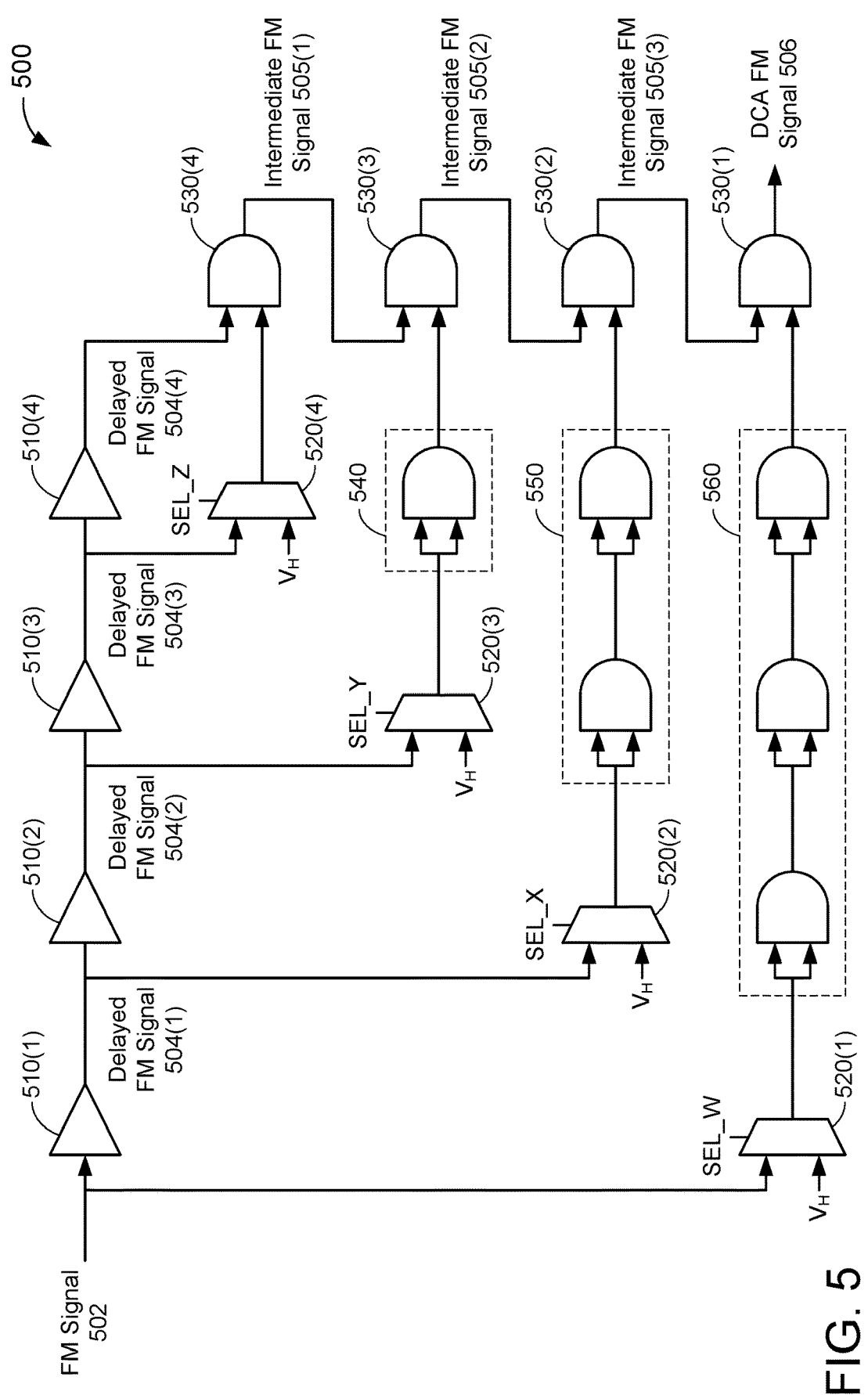
FIG. 5 shows another circuit diagram of an example duty cycle controller, according to some implementations.

FIG. 5 shows another circuit diagram of an example duty cycle controller 500, according to some implementations. The duty cycle controller 500 is configured to adjust the duty cycle of an FM signal 502. More specifically, the duty cycle controller 500 produces a DCA FM signal 506 having the same frequency and amplitude as the FM signal 502, but a different duty cycle. In some implementations, the duty cycle controller 500 may be one example of the duty cycle controller 200 of FIG. 2. With reference to FIG. 2, the FM signal 502 may be one example of the FM signal 202 and the DCA FM signal 506 may be one example of the DCA FM signal 206.

The duty cycle controller 500 includes a tapped delay line formed by a series of delay stages 510(1)-510(4), switching circuitry formed by a number of multiplexers 520(1)-520(4) (which can also be implemented using AND logic gates, each having one inverted input gate, with a transfer function $Y=\overline{A}*B$), and a series of logic gates 530(1)-530(4). The first delay stage 510(1) delays the FM signal 502 by a fixed or predetermined amount, resulting in a delayed FM signal 504(1). Each of the subsequent delay stages 510(2)-510(4) applies an equivalent amount of delay (as the first delay stage 510(1)) to the output of the preceding delay stage, resulting in additional delayed FM signals 504(2)-504(4), respectively. Thus, each of the delayed FM signals 504(1)-504(4) has a different phase offset relative to the original FM signal 502. Although four delay stages 510(1)-510(4) are shown in FIG. 5, the delay line may include fewer or more delay stages in actual implementations.

The switching circuitry is configured to select one or more FM signals (including the original FM signal 502 or any of the delayed FM signals 504(1)-504(3)) to be combined with the delayed FM signal 504(4) via the logic gates 530(1)-530(4). In some implementations, each of the multiplexers 520(1)-520(4) may output a respective FM signal or a constant voltage ($V_H$) associated with a high logic state based on a select signal. For example, multiplexer 520(1) may output the original FM signal 502 or the constant voltage $V_H$ based on a first select signal (SEL_W), multiplexer 520(2) may output the delayed FM signal 504(1) or the constant voltage $V_H$ based on a second select signal (SEL_X), multiplexer 520(3) may output the delayed FM signal 504(2) or the constant voltage $V_H$ based on a third select signal (SEL_Y), and multiplexer 520(4) may output the delayed FM signal 504(3) or the constant voltage $V_H$ based on a fourth select signal (SEL_Z).

The logic gates 530(1)-530(4) are configured to combine the delayed FM signal 504(4) with the outputs of the multiplexers 520(1)-520(4), using combinational logic, to produce the DCA FM signal 506. In the example of FIG. 5, each of the logic gates 530(1)-530(4) is depicted as an AND logic gate that produces an output signal based on the logical AND of two input signals (such as described with reference to FIG. 3). In some other implementations, the logic gates 530(1)-530(4) may implement various other logic suitable for producing the DCA FM signal 506 (such as NAND logic). In some implementations, the logic gates 530(1)-530(4) may be coupled in a cascaded configuration so that the output of each logic gate is provided as an input to the next logic gate in the cascade, where the last logic gate in the cascade outputs the DCA FM signal 506. More specifically, each logic gate combines the output of a respective multiplexer with the output of a previous logic gate in the cascade (or the delayed FM signal 504(4)).

For example, the logic gate 530(4) combines the delayed FM signal 504(4) with the output of the multiplexer 520(4), using AND logic, to produce a first intermediate FM signal 505(1). When the multiplexer 520(4) outputs the constant voltage $V_H$ (based on the select signal SEL_Z), the intermediate FM signal 505(1) simply tracks the delayed FM signal 504(4). In other words, the constant voltage $V_H$ causes the logic gate 530(4) to output the delayed FM signal 504(4), unchanged. However, when the multiplexer 520(4) outputs the delayed FM signal 504(3), the intermediate FM signal 505(1) has a different duty cycle than the delayed FM signal 504(4). With reference to FIG. 3, the delayed FM signal 504(3) may be one example of the FM signal 302, the delayed FM signal 504(4) may be one example of the delayed FM signal 304, and the intermediate FM signal 505(1) may be one example of the DCA FM signal 306.

The logic gate 530(3) combines the intermediate FM signal 505(1) with the output of the multiplexer 520(3), using AND logic, to produce a second intermediate FM signal 505(2). When the multiplexer 520(3) outputs the constant voltage $V_H$ (based on the select signal SEL_Y), the intermediate FM signal 505(2) simply tracks the intermediate FM signal 505(1). In other words, the constant voltage $V_H$ causes the logic gate 530(3) to output the intermediate FM signal 505(1), unchanged. However, when the multiplexer 520(3) outputs the delayed FM signal 504(2), the intermediate FM signal 505(2) has a different duty cycle than the intermediate FM signal 505(1). With reference to FIG. 3, the delayed FM signal 504(2) may be one example of the FM signal 302, the intermediate FM signal 505(1) may be one example of the delayed FM signal 304, and the intermediate FM signal 505(2) may be one example of the DCA FM signal 306.

The logic gate 530(2) combines the intermediate FM signal 505(2) with the output of the multiplexer 520(2), using AND logic, to produce a third intermediate FM signal 505(3). When the multiplexer 520(2) outputs the constant voltage $V_H$ (based on the select signal SEL_X), the intermediate FM signal 505(3) simply tracks the intermediate FM signal 505(2). In other words, the constant voltage $V_H$ causes the logic gate 530(2) to output the intermediate FM signal 505(2), unchanged. However, when the multiplexer 520(2) outputs the delayed FM signal 504(1), the intermediate FM signal 505(3) has a different duty cycle than the intermediate FM signal 505(2). With reference to FIG. 3, the delayed FM signal 504(1) may be one example of the FM signal 302, the intermediate FM signal 505(2) may be one example of the delayed FM signal 304, and the intermediate FM signal 505(3) may be one example of the DCA FM signal 306.

The logic gate 530(1) combines the intermediate FM signal 505(3) with the output of the multiplexer 520(1), using AND logic, to produce the DCA FM signal 506. When the multiplexer 520(1) outputs the constant voltage $V_H$ (based on the select signal SEL_W), the DCA FM signal 506 simply tracks the intermediate FM signal 505(3). In other words, the constant voltage $V_H$ causes the logic gate 530(1) to output the intermediate FM signal 505(3), unchanged. However, when the multiplexer 520(1) outputs the original FM signal 502, the DCA FM signal 506 has a different duty cycle than the intermediate FM signal 505(3). With reference to FIG. 3, the original FM signal 502 may be one example of the FM signal 302, the intermediate FM signal 505(3) may be one example of the delayed FM signal 304, and the DCA FM signal 506 may be one example of the DCA FM signal 306.

The duty cycle of the DCA FM signal 506 depends on which of the FM signals 502 or 504(1)-504(3) are provided as inputs to the logic gates 530(1)-530(4). For example, combining the delayed FM signal 504(4) with the original FM signal 502 results in a DCA FM signal 506 having a relatively small duty cycle, whereas combining the delayed FM signal 504(4) with the delayed FM signal 504(3) results in a DCA FM signal 506 having a much larger duty cycle. The select signals SEL_W-SEL_Z control the outputs of the multiplexers 520(1)-520(4). As such, the values of the select signals SEL_W-SEL_Z determine the duty cycle of the DCA FM signal 506. In some implementations, the duty cycle controller 500 may receive a digital control word indicating the values of the select signals SEL_W-SEL_Z. As described with reference to FIG. 2, the duty cycle of the DCA FM signal 506 affects the output power of the power amplifier used to transmit the DCA FM signal 506. Thus, in some implementations, the digital control word may be associated with a target output power of the power amplifier (such as the target output power 203 of FIG. 2).

In some implementations, the digital control word may cause only one of the multiplexers 520(1)-520(4) to output an FM signal while the remaining multiplexers output the constant voltage $V_H$. In some other implementations, the digital control word may cause multiple multiplexers 520 (1)-520(4) to output a respective FM signal. Because the outputs of the multiplexers 520(1)-520(4) are combined in a cascaded manner, changes in duty cycle can be accumulated over the series of logic gates 530(1)-530(4). Aspects of the present disclosure recognize that accumulating multiple incremental changes in duty cycle may result in a more linear DCA FM signal 506. More generally, the number of incremental changes in duty cycle affects the linearity of the DCA FM signal 506.

In some implementations, to reduce redundancy, the duty cycle controller 500 may accept (as inputs) only certain permutations or patterns of the digital control word. More specifically, the patterns of digital control words may be selected to achieve a more linear response for the power amplifier. For some applications, where two different patterns of digital control words produce respective DCA FM signals 506 that result in the same output power at the power amplifier (where one of the digital control words produces a more linear DCA FM signal 506 than the other), the pattern associated with the more nonlinear DCA FM signal 506 may be selected over the pattern associated with the more linear DCA FM signal 506 as input to the duty cycle controller 500. For some other applications, the pattern associated with the more linear DCA FM signal 506 may be selected over the pattern associated with the more nonlinear DCA FM signal 506 as input to the duty cycle controller 500.

Aspects of the present disclosure further recognize that each of the logic gates 530(1)-530(3) may add an amount of gate delay to the intermediate FM signal at its output. In some aspects, the duty cycle controller 500 may adjust the FM signal 502 and the delayed FM signals 504(1) and 504(2) to compensate for the gate delay associated with the logic gates 530(1)-530(3). For example, the duty cycle controller 500 may include a first gate delay (GD) compensation component 540 which compensates for the delay applied to the intermediate FM signal 505(1) by the logic gate 530(4), a second GD compensation component 550 which compensates for the delay applied to the intermediate FM signal 502(2) by the logic gates 530(3) and 530(4), and a third GD compensation component 560 which compensates for the delay applied to the intermediate FM signal 505(3) by the logic gates 530(2), 530(3), and 530(4).

The first GD compensation component 540 includes a single AND logic gate configured to receive the output of the multiplexer 520(3) as its inputs. Thus, the output of the multiplexer 520(3) is delayed by a gate delay, through the first GD compensation component 540, equivalent to the gate delay associated with the logic gate 530(4). The second GD compensation component 550 includes a pair of AND logic gates coupled in series, where the first logic gate is configured to receive the output of the multiplexer 520(2) as its inputs and the second logic gate is configured to receive the output of the first logic gate as its inputs. Thus, the output of the multiplexer 520(2) is delayed by multiple gate delays, through the second GD compensation component 550, equivalent to the gate delays associated with the logic gates 530(3) and 530(4).

The third GD compensation component 560 includes three AND logic gates coupled in series, where the first logic gate is configured to receive the output of the multiplexer 520(1) as its inputs, the second logic gate is configured to receive the output of the first logic gate as its inputs, and the third logic gate is configured to receive the output of the second logic gate as its inputs. Thus, the output of the multiplexer 520(1) is delayed by multiple gate delays, through the third GD compensation component 560, equivalent to the gate delays associated with the logic gates 530(2), 530(3), and 530(4). As a result, the gate delays applied to the FM signal 502 and the delayed FM signals 504(1) and 504(2) offset the gate delays applied to the intermediate FM signals 505(1)-505(3) when the signals are combined at the logic gates 530(1)-530(3).

Figure 6:
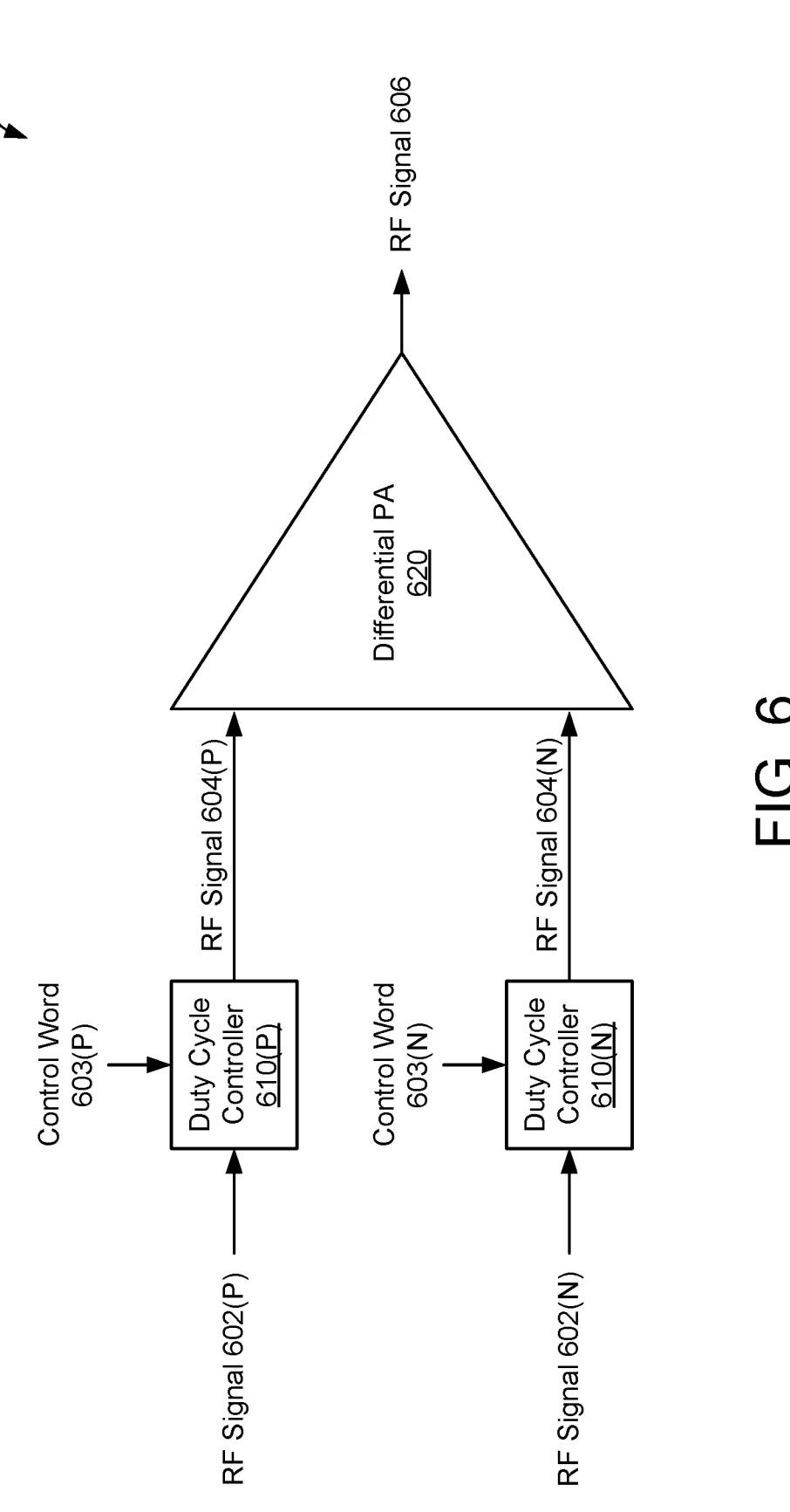
FIG. 6 shows another block diagram of an example RF transmitter, according to some implementations.

FIG. 6 shows another block diagram of an example RF transmitter 600, according to some implementations. The RF transmitter 600 is configured to transmit a frequency-modulated differential RF signal over a wireless communication channel, where the differential RF signal is represented by a pair of complementary RF signals 602(P) and 602(N). As a differential pair, the RF signals 602(P) and 602(N) have the same frequency and amplitude but are opposite in polarity to one another.

The RF transmitter 600 includes a pair of duty cycle controllers 610(P) and 610(N) and a differential power amplifier (PA) 620. The first duty cycle controller 610(P) is configured to adjust the duty cycle of the RF signal 602(P) based on a first control word 603(P). More specifically, the first duty cycle controller 610(P) may produce an RF signal 604(P) having the same frequency and amplitude, but a different duty cycle, as the RF signal 602(P). The second duty cycle controller 610(N) is configured to adjust the duty cycle of the RF signal 602(N) based on a second control word 603(N). More specifically, the second duty cycle controller 610(N) may produce an RF signal 604(N) having the same frequency and amplitude, but a different duty cycle, as the RF signal 602(N).

The differential power amplifier 620 amplifies the difference in phase and duty cycle between the RF signals 604(P) and 604(N) to produce an amplified RF signal 606 for transmission over the wireless communication channel. As a result, the amplified RF signal 606 has a higher output power than either of the RF signals 604(P) or 604(N). In some implementations, each of the duty cycle controllers 610(P) and 610(N) may be one example of any of the duty cycle controllers 130, 200, 400, or 500 of FIGS. 1, 2, 4, and 5, respectively. For example, the duty cycle controllers 610(P) and 610(N) may adjust the duty cycles of the RF signals 604(P) and 604(N) based on a target output power associated with the differential power amplifier 620. In some implementations, the control words 603(P) and 603(N) may be associated with the target output power of the differential power amplifier 620 (such as described with reference to FIG. 2).

Aspects of the present disclosure recognize that by amplifying the differences between the RF signals 604(P) and 604(N), the differential power amplifier 620 may eliminate or remove output harmonics from the amplified RF signal 606. More specifically, when the complementary RF signals 604(P) and 604(N) are 180° out of phase, even-ordered harmonics cancel out in an ideal differential power amplifier 620. However, when the differential power amplifier 620 is non-ideal, the RF signals 604(P) and 604(N) are not fully differential. In other words, the phase difference between the power amplifier's complimentary stages is not equal to 180°. In some implementations, the duty cycle controllers 610(P) and 610(N) may further adjust the phases of one or more of the RF signals 604(P) or 604(N) to ensure that the signals are 180° out of phase when combined in the differential power amplifier 620. In this manner, the duty cycle controllers 610(P) and 610(N) may further reduce the output harmonics of the amplified RF signal 606.

Figure 7:
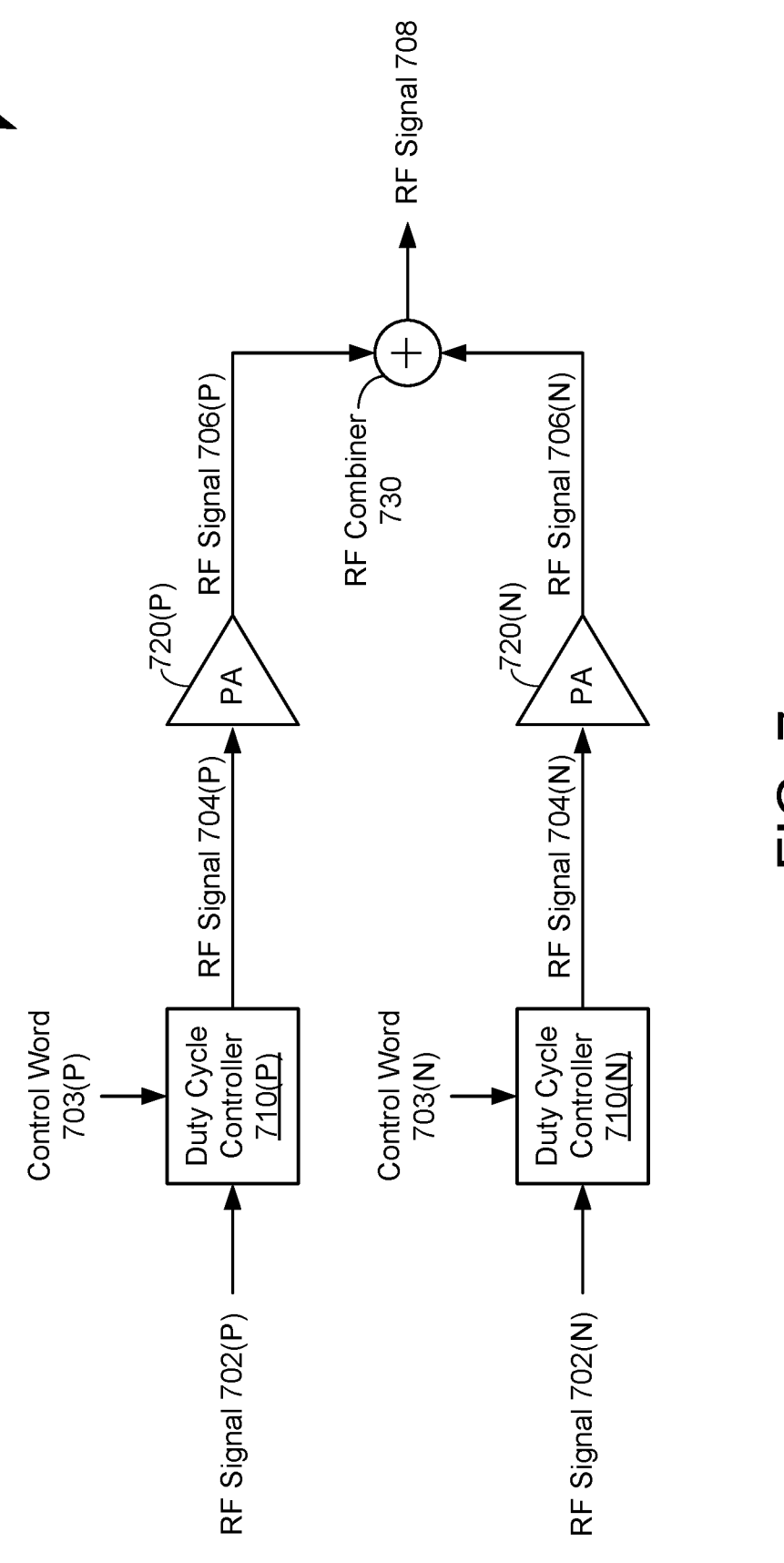
FIG. 7 shows another block diagram of an example RF transmitter, according to some implementations.

FIG. 7 shows another block diagram of an example RF transmitter 700, according to some implementations. The RF transmitter 700 is configured to transmit a frequency-modulated differential RF signal over a wireless communication channel, where the differential RF signal is represented by a pair of complementary RF signals 702(P) and 702(N). As a differential pair, the RF signals 702(P) and 702(N) have the same frequency and amplitude but are opposite in polarity to one another.

The RF transmitter 700 includes a pair of duty cycle controllers 710(P) and 710(N), power amplifiers 720(P) and 720(N), and an RF signal combiner 730. The first duty cycle controller 710(P) is configured to adjust the duty cycle of the RF signal 702(P) based on a first control word 703(P). More specifically, the first duty cycle controller 710(P) may produce an RF signal 704(P) having the same frequency and amplitude, but a different duty cycle, as the RF signal 702(P). The second duty cycle controller 710(N) is configured to adjust the duty cycle of the RF signal 702(N) based on a second control word 703(N). More specifically, the second duty cycle controller 710(N) may produce an RF signal 704(N) having the same frequency and amplitude, but a different duty cycle, as the RF signal 702(N).

The power amplifiers 720(P) and 720(N) amplify the RF signals 704(P) and 704(N), respectively, to produce amplified RF signals 706(P) and 706(N). The RF signal combiner 730 is configured to combine the amplified RF signals 706(P) and 706(N) to produce a combined RF signal 708 having a higher output power than either of the amplified RF signals 706(P) or 706(N). In some implementations, each of the duty cycle controllers 710(P) and 710(N) may be one example of any of the duty cycle controllers 130, 200, 400, or 500 of FIGS. 1, 2, 4, and 5, respectively. For example, the first duty cycle controller 710(P) may adjust the duty cycle of the RF signal 704(P) based on a target output power associated with the power amplifier 720(P) and the second duty cycle controller 710(N) may adjust the duty cycle of the RF signal 704(N) based on a target output power associated with the power amplifier 720(N). In some implementations, the control words 703(P) and 703(N) may be associated with the target output powers of the power amplifiers 720(P) and 720(N), respectively (such as described with reference to FIG. 2).

Aspects of the present disclosure recognize that by combining the amplified RF signals 706(P) and 706(N), the RF signal combiner 730 may eliminate or remove output harmonics from the combined RF signal 708. More specifically, when the amplified RF signals 706(P) and 706(N) are 180° out of phase, even-ordered harmonics cancel out when the amplified RF signals 706(P) and 706(N) are combined in an ideal RF signal combiner 730. However, when the power amplifiers 720(P) and 720(N) and the RF signal combiner 730 are non-ideal, the RF signals 706(P) and 706(N) are not fully differential. In other words, the phase difference between the RF signals 706(P) and 706(N) is not equal to 180° when the signals are combined in the RF signal combiner 730. In some implementations, the duty cycle controllers 710(P) and 710(N) may further adjust the phases of one or more of the RF signals 704(P) or 704(N) to ensure that the amplified RF signals 706(P) and 706(N) are 180° out of phase when combined in the RF signal combiner 730. In this manner, the duty cycle controllers 710(P) and 710(N) may further reduce the output harmonics of the combined RF signal 708.

Figure 8:
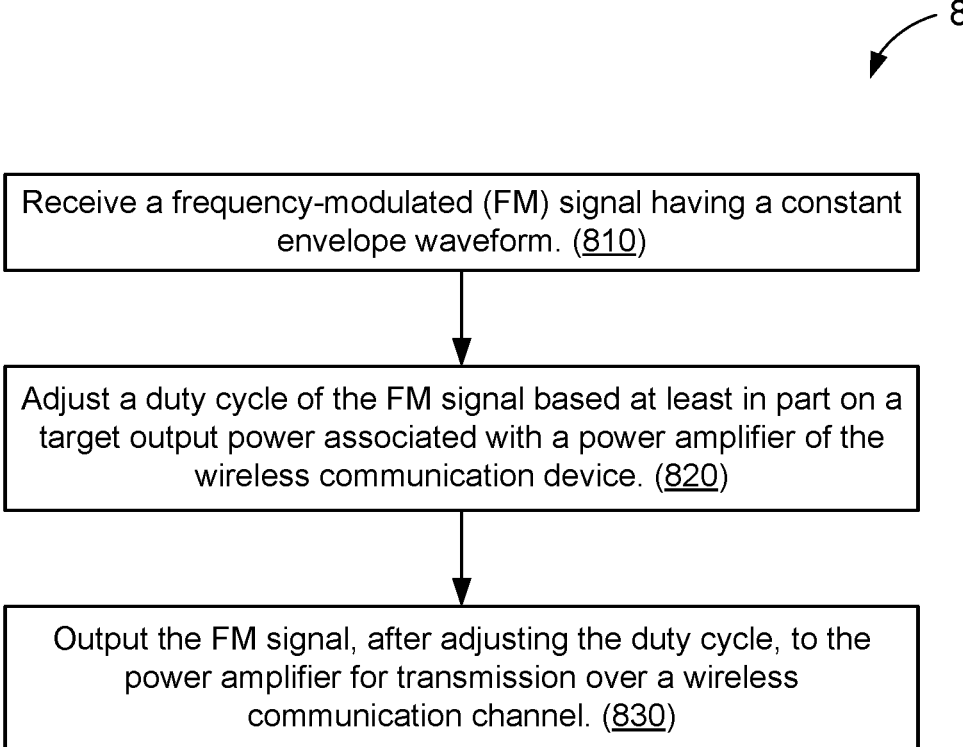
FIG. 8 shows an illustrative flowchart depicting an example operation performed by a duty cycle controller for a wireless communication device, according to some implementations.

FIG. 8 shows an illustrative flowchart depicting an example operation 800 performed by a duty cycle controller for a wireless communication device, according to some implementations. In some implementations, the duty cycle controller may be one example of any of the duty cycle controllers 120, 200, 400, or 500 of FIGS. 1, 2, 4, and 5, respectively.

The duty cycle controller receives a frequency-modulated (FM) signal (810). The duty cycle controller adjusts a duty cycle of the FM signal based at least in part on a target output power associated with a power amplifier of the wireless communication device (820). In some implementations, the adjusted duty cycle of the FM signal may cause the power amplifier to operate at the target output power. In some implementations, the target output power may be less than a maximum power output of the power amplifier. In some implementations, the adjusting of the duty cycle may include reducing the duty cycle of the FM signal. In some implementations, the adjusted duty cycle may be less than 50%. The duty cycle controller outputs the FM signal, after adjusting the duty cycle, to the power amplifier for transmission over a wireless communication channel (830).

In some aspects, the adjusting of the duty cycle may include delaying the FM signal by a duration associated with the target output power and combining the FM signal with the delayed FM signal based on combinational logic. In some implementations, the adjusting of the duty cycle may include applying a series of delays to the FM signal that produces a series of delayed FM signals, respectively, selecting one or more delayed FM signals in the series of delayed FM signals based on the target output power, and combining the FM signal with the one or more delayed FM signals based on combinational logic. In some implementations, the selecting of the one or more delayed FM signals may include receiving a digital control word indicating the selection of the one or more delayed FM signals.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method performed by a duty cycle controller for a wireless communication device, comprising:
receiving a frequency-modulated (FM) signal having a constant envelope waveform;
adjusting a duty cycle of the FM signal based at least in part on a target output power associated with a power amplifier of the wireless communication device; and,
the adjusting of the duty cycle including:
delaying the FM signal by a duration associated with the target output power; and
combining the FM signal with the delayed FM signal based on combinational logic; and
outputting the FM signal, after adjusting the duty cycle, to the power amplifier for transmission over a wireless communication channel.

2. The method of claim 1, wherein the adjusted duty cycle of the FM signal causes the power amplifier to operate at the target output power.

3. The method of claim 1, wherein the target output power is less than a maximum power output of the power amplifier.

4. The method of claim 1, wherein the adjusting of the duty cycle comprises reducing the duty cycle of the FM signal.

5. The method of claim 1, wherein the adjusted duty cycle is less than 50%.

6. The method of claim 1, wherein the delaying of the FM signal comprises:

applying a series of delays to the FM signal that produces a series of delayed FM signals, respectively; and selecting one or more delayed FM signals in the series of delayed FM signals based on the target output power, the FM signal being combined with the one or more delayed FM signals based on the combinational logic.

7. The method of claim 6, wherein the selecting of the one or more delayed FM signals comprises:

receiving a digital control word indicating the selection of the one or more delayed FM signals.

8. A duty cycle controller for a wireless communication device, the duty cycle controller comprising:

a delay line configured to receive a frequency-modulated (FM) signal having a constant envelope waveform; and control circuitry coupled to the delay line and configured to:

adjust a duty cycle of the FM signal based at least in part on a target output power associated with a power amplifier of the wireless communication device, the adjusting of the duty cycle including:

delaying the FM signal by a duration associated with the target output power; and combining the FM signal with the delayed FM signal based on combinational logic; and output the FM signal, after adjusting the duty cycle, to the power amplifier for transmission over a wireless communication channel.

9. The duty cycle controller of claim 8, wherein the adjusted duty cycle of the FM signal causes the power amplifier to operate at the target output power.

10. The duty cycle controller of claim 8, wherein the target output power is less than a maximum power output of the power amplifier.

11. The duty cycle controller of claim 8, wherein the adjusting of the duty cycle comprises reducing the duty cycle of the FM signal.

12. The duty cycle controller of claim 8, wherein the adjusted duty cycle is less than 50%.

13. The duty cycle controller of claim 8, wherein the delay line is further configured to apply a series of delays to the FM signal that produces a series of delayed FM signals, respectively.

14. The duty cycle controller of claim 13, wherein the control circuitry comprises:

switching circuitry configured to select one or more delayed FM signals in the series of delayed FM signals based on the target output power; and one or more logic gates configured to produce the adjusted duty cycle based on the received FM signal and the one or more delayed FM signals.

15. The duty cycle controller of claim 14, wherein the switching circuitry comprises one or more multiplexers each having a plurality of inputs.

16. The duty cycle controller of claim 15, wherein each of the one or more multiplexers has an output switchably coupled to one of the plurality of inputs based on a digital control word.

17. The duty cycle controller of claim 15, wherein the plurality of inputs comprises:

a first input configured to receive a first delayed FM signal in the series of delayed FM signals; and a second input configured to receive a second delayed FM signal in the series of delayed FM signals.

18. The duty cycle controller of claim 15, wherein the plurality of inputs comprises:

a first input configured to receive a respective delayed FM signal in the series of delayed FM signals; and a second input configured to receive a voltage representing a logic-high state associated with the one or more logic gates.

19. A system comprising:

a modulator configured to modulate data onto a carrier signal according to a constant envelope frequency modulation (FM) scheme;

a power amplifier configured to amplify the modulated carrier signal for transmission over a wireless communication channel; and a duty cycle controller configured to adjust a duty cycle of the modulated carrier signal, prior to being amplified by the power amplifier, based at least in part on a target output power associated with the power amplifier, the adjusting of the duty cycle including:

delaying the modulated carrier signal by a duration associated with the target output power, and combining the modulated carrier signal with the delayed modulated carrier signal based on combinational logic.

* * * * *